United States Patent
Schmitt-Weaver et al.

(10) Patent No.: US 11,022,896 B2
(45) Date of Patent: Jun. 1, 2021

(54) MARK POSITION DETERMINATION METHOD

(71) Applicant: ASML NETHERLANDS B.V., Veldhoven (NL)

(72) Inventors: Emil Peter Schmitt-Weaver, Eindhoven (NL); Amir Bin Ismail, Eindhoven (NL); Kaustuve Bhattacharyya, Veldhoven (NL); Paul Derwin, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 358 days.

(21) Appl. No.: 16/083,076

(22) PCT Filed: Feb. 22, 2017

(86) PCT No.: PCT/EP2017/054053
§ 371 (c)(1),
(2) Date: Sep. 7, 2018

(87) PCT Pub. No.: WO2017/153171
PCT Pub. Date: Sep. 14, 2017

(65) Prior Publication Data
US 2019/0064680 A1    Feb. 28, 2019

(30) Foreign Application Priority Data
Mar. 11, 2016 (EP) ..................... 16159959

(51) Int. Cl.
*G03F 7/20* (2006.01)
*G03F 9/00* (2006.01)

(52) U.S. Cl.
CPC .......... *G03F 7/70633* (2013.01); *G03F 7/705* (2013.01); *G03F 7/70625* (2013.01); *G03F 9/7088* (2013.01); *G03F 9/7092* (2013.01)

(58) Field of Classification Search
CPC ........ G03F 7/22; G03F 7/705; G03F 7/70625; G03F 7/70633; G03F 9/7088; G03F 9/7092
USPC ..................................................... 430/22, 30
See application file for complete search history.

(56) References Cited

U.S. PATENT DOCUMENTS

| | | |
|---|---|---|
| 2006/0033921 A1 | 2/2006 | Den Boef et al. |
| 2006/0066855 A1 | 3/2006 | Boef et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2014/0089870 A1 | 3/2014 | Mos et al. |
| 2014/0192338 A1 | 7/2014 | Den Boef |
| 2015/0241790 A1 | 8/2015 | Pierson et al. |

FOREIGN PATENT DOCUMENTS

| | | |
|---|---|---|
| TW | 201539601 | 10/2015 |
| WO | 2015110191 | 7/2015 |
| WO | 2015134709 | 9/2015 |

OTHER PUBLICATIONS

International Search Report and Written Opinion issued in corresponding PCT Patent Application No. PCT/EP2017/054053, dated Jun. 29, 2017.
Taiwanese Office Action issued in corresponding Taiwanese Patent Application No. 106107716, dated Jan. 18, 2018.
Chang, Ray C., et al.: "Throughput improvement from routing reduction by using CPE (correction per exposure)", Proc. of SPIE, vol. 7140, Nov. 4, 2008, pp. 714043-1-714043-9.
"Spline Models for Wafer Modelling in Lithography", Research Disclosure, Feb. 25, 2016.
Japanese Office Action issued in corresponding Japanese Patent Application No. 2018-541285, dated Aug. 28, 2019.

*Primary Examiner* — Christopher G Young
(74) *Attorney, Agent, or Firm* — Pillsbury Winthrop Shaw Pittman LLP

(57) ABSTRACT

Corrections are calculated for use in controlling a lithographic apparatus. Using a metrology apparatus a performance parameter is measured at sampling locations across one or more substrates to which a lithographic process has previously been applied. A process model is fitted to the measured performance parameter, and an up-sampled estimate is provided for process-induced effects across the substrate. Corrections are calculated for use in controlling the lithographic apparatus, using an actuation model and based at least in part on the fitted process model. For locations where measurement data is available, this is added to the estimate to replace the process model values. Thus, calculation of actuation corrections is based on a modified estimate which is a combination of values estimated by the process model and partly on real measurement data.

20 Claims, 3 Drawing Sheets

MARK POSITION DETERMINATION METHOD

CROSS-REFERENCE TO RELATED APPLICATIONS

This application is the U.S. national phase entry of PCT patent application no. PCT/EP2017/054053, which was filed on Feb. 22, 2017, which claims the benefit of priority of European patent application no. 16159959.2, which was filed on Mar. 11, 2016, and which is incorporated herein in its entirety by reference.

BACKGROUND

Field of the Invention

The present invention relates to methods and apparatus for calculating corrections for use in controlling a manufacturing process. The invention can be applied for example in controlling a process step in a lithographic manufacturing process. a The invention can be applied for example to control a lithographic apparatus, when applying patterns at locations across one or more substrates. The invention can be applied aa metrology apparatus. The present invention further relates to methods of manufacturing devices, and to data processing apparatuses and computer program products for implementing parts of such a method.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications US2014192338 and US2011069292A1 which documents are hereby incorporated by reference in their entirety. Further developments of the technique have been described in published patent publications US20110027704A, US20110043791A, US2011102753A1, US20120044470A, US20120123581A, US20130258310A and US20130271740A. These targets can be smaller than the illumination spot and may be surrounded by product structures on a wafer. Multiple gratings can be measured in one image, using a composite grating target. The contents of all these applications are also incorporated herein by reference.

Such techniques bring the ability to measure performance of the lithographic process with high spatial density across the substrate. This in turn allows sophisticated process corrections to be included in the control of the patterning operations performed by the lithographic apparatus. These corrections can include process corrections, for example to correct distortions caused by the various chemical and physical processes to which the substrate is subjected, between the patterning operations on successive layers. Some modern lithographic apparatuses provide a mechanism for "correction per exposure" or CPE. Based on measurements of a population of substrates previously processed, a set of additional corrections is defined that varies with the field position over the substrate. This CPE component is added to the other corrections defined at a substrate level, to optimize performance of the patterning operation at every field location.

CPE and other process corrections are a facility provided by the lithographic apparatus and its control system, but it is for the operator of the production facility to determine the corrections, depending on the measurement data and tools available. CPE corrections have been defined manually, in some cases. More recently, automated calibration methods have been proposed to calculate corrections. Whatever method is used, the corrections ultimately must fit within the degrees of freedom available for control of the lithographic apparatus. These degrees of freedom are represented by one or more actuation models, in the terminology of the present disclosure.

The spatial density of metrology targets is typically limited, to avoid stealing too much space from the functional product structures. Furthermore even with a high spatial density of possible measurement locations, to actually measure every target would adversely affect throughput of the lithographic process of the metrology apparatus in high-volume manufacture. The sampling scheme for obtaining the measurement data can be optimized with automated tools, for example as described in patent publication WO2015110191A1. Nevertheless, the density of samples is generally going to be limited.

Patent publication US2014089870A1 (Mos et al) describes a system in which a process signature model is calculated from measurement data from a sample of locations across a sample of substrates. The contents of that publication are incorporated herein by reference. The process signature model effectively up-samples the measurement data, to provide a higher density of sample points representing the process effects of interest. This higher density representation in turn is used with the actuation model(s) to calculate the corrections. A benefit of this approach is that the process signature model be designed to represent more accurately the substrate and the process effects. The up-sampling allows more effective process corrections to be applied than earlier schemes in which the measurement data was fed directly to the actuation model.

A simple process signature model generally cannot represent the full range of effects represented in the measurement data. For example, there may be variations very local to the substrate edge that are not captured fully by a process signature model designed to capture process signatures over the whole substrate. One option that has been proposed is to define additional models specifically for these effects, such as an edge effect model. Such models increase overall system complexity however, and have limited benefit unless the measurement data is available to represent the additional effects accurately.

SUMMARY OF THE INVENTION

The present invention has the aim of improving performance of corrections using a process model, without necessarily increasing the number of measurement locations required to be measured, and without increasing process model complexity.

According to an aspect of the invention, there is provided a method of calculating corrections calculating corrections for use in a manufacturing process, the method comprising:

measuring a performance parameter at sampling locations across one or more substrates;

fitting a process model to the measured performance parameter; and calculating said corrections based at least in part on the fitted process model, wherein the calculation of said corrections is based partly on the fitted process model and partly on the measured performance parameter.

The manufacturing process may be for example a lithographic manufacturing process, of the type described above. The corrections may be for use in controlling a patterning step of the process, or a different step. By using both the process model and the actual measurement data, the corrections calculated can take into account effects which are (for example) too local to be represented in the process model, without adding another layer of process modeling. The benefits of the process signature model are also obtained. In one embodiment, the method simply replaces values in the up-sampled process model with real measurement values, where real measurement values are available. Other methods of combining the data can be considered.

According to an aspect of the invention, there is provided a metrology system for obtaining measurements for use in monitoring a manufacturing process, the metrology system comprising:

inspection apparatus for measuring a performance parameter at sampling locations across one or more substrates; and a processing apparatus for fitting a process model to the measured performance parameter, and generating an estimate of process effects to be corrected in the manufacturing process, wherein the processing apparatus is arranged to generate the estimate of process effects based partly on the fitted process model and partly on the measured performance parameter.

According to another aspect of the invention, there is provided a manufacturing system comprising a metrology system according to the invention as set forth above in combination with at least one processing apparatus and a controller, the controller being arranged to calculate corrections based on the generated estimate of process effects and to control the processing apparatus to use the calculated actuation corrections in applying a pattern to one or more substrates.

The generated estimate can be used for example to calculate corrections in the positioning of a pattern applied in a lithographic apparatus. Such positioning may be in the plane of the substrate (overlay control), or perpendicular to the plane (focus control).

The generated estimate can be used for example to calculate corrections which vary between field locations on the substrate. Such corrections can be applied using the existing CPE mechanisms, for example.

The invention further provides a device manufacturing method comprising applying patterns in one or more layers on a substrate and processing the substrate to produce functional device features, wherein processing of at least one of said layers is controlled using actuation corrections calculated by a method according to the invention as set forth above.

The apparatus and method of the invention can be implemented in some embodiments by modifying control software of existing apparatuses.

The invention further provides a computer program product comprising machine-readable instructions for causing one or more processors to implement the controller of a lithographic apparatus according to the invention as set forth above.

The invention further provides a data processing system comprising one or more processors programmed to implement the controller of a manufacturing system according to the invention as set forth above.

The invention further provides a computer program product comprising machine-readable instructions for causing a programmable data processing apparatus to perform as the processing apparatus of a metrology system according to the invention as set forth above.

The invention further provides a method of modeling a performance parameter across a substrate, the method comprising:

measuring a performance parameter at sampling locations across one or more substrates;

fitting a process model to the measured performance parameter; and generating an estimate of process effects present on the substrate, wherein the estimate of process effects is generated using both the fitted process model and the measured performance parameter.

The invention yet further provides a computer program product comprising instructions for causing a programmable data processing apparatus to generate the estimate of process effects in a method of modelling according to the invention as set forth above.

BRIEF DESCRIPTION OF THE DRAWINGS

Embodiments of the invention will now be described, by way of example only, with reference to the accompanying schematic drawings in which.

DETAILED DESCRIPTION OF EXEMPLARY EMBODIMENTS

Before describing embodiments of the invention in detail, it is instructive to present an example environment in which embodiments of the present invention may be implemented. A lithographic process for the manufacture of semiconductor devices will be presented as an example of a manufacturing process, while the principles of the present disclosure can be applied in other processes without limitation.

Figure 1:
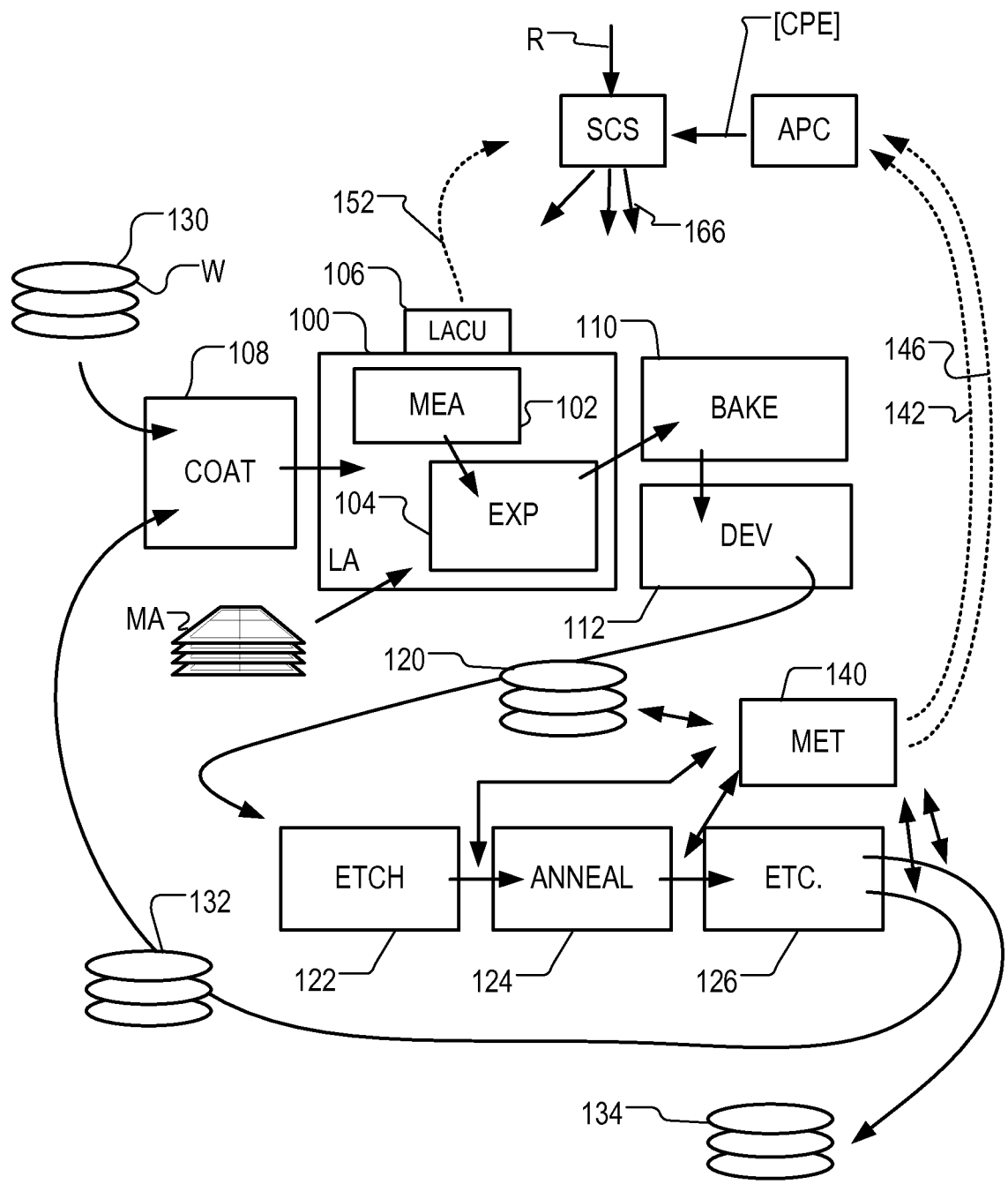
FIG. 1 depicts a lithographic apparatus together with other apparatuses forming a production facility for semiconductor devices, as an example of a manufacturing system according to an embodiment of the invention.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Alternatively, the measurement station and exposure station can be combined. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty.

In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

The present disclosure concerns the application of corrections to correct process effects in the substrates undergoing the manufacturing process. In the example of a lithographic manufacturing process, the substrates are semiconductor wafers or other substrates to which patterns are to be applied in a patterning step, and structures formed by physical and chemical process steps. The process corrections in the described examples will be corrections applied in the patterning step, in particular corrections to control the exact positioning of the applied pattern relative to features already on the substrate. These corrections may be for example corrections per exposure, or CPE, applied by a lithographic apparatus. The corrections may alternatively be corrections in the control of another process step within the overall manufacturing process.

As discussed in the introduction above, CPE is a mechanism which allows corrections to be defined and applied individual field locations across the substrate. These corrections based measurements of previously processed substrates, which are subjected to patterning operations in the production facility of FIG. 1 for example. For the purpose of the present disclosure, it is assumed that corrections are calculated using a process signature model of the type described in US2014089870A1, mentioned above. The entire contents of US2014089870A1 are incorporated herein by reference. The principles of the process signature model will not be repeated here in detail.

Figure 2:
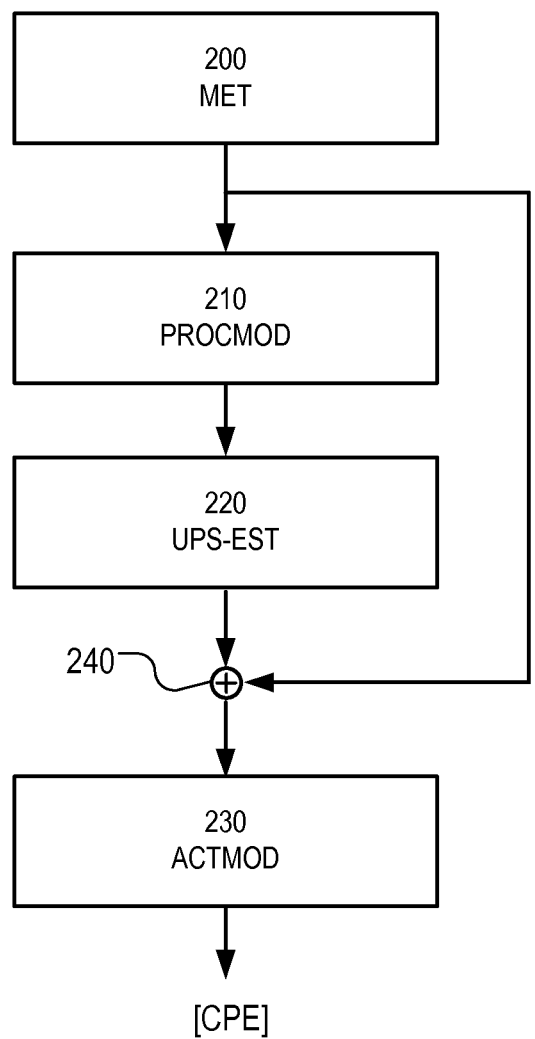
FIG. 2 is a flowchart of a method of generating corrections in the production facility for FIG. 1.

FIG. 2 is a flow diagram illustrating a method of generating corrections according to the principles of the present disclosure, within the semiconductor manufacturing facility of FIG. 1. The method is based in this example on the methods described in US2014089870A1. Steps 200-230 will be described which correspond to the known method. Then step 240 will be described which implements the modification disclosed herein by combining data from the process signature model with real measurement data, to generate a modified estimate of process effects. The same modification can be applied in the context of methods other than that disclosed in US2014089870A1.

In a first step 200, measurements are performed on a substrate wafer using the metrology apparatus 140, for example. The measurements comprising the amount that a certain performance parameter (for example, overlay) deviates from the ideal (zero overlay) at a number of locations where suitable metrology targets have been formed. The number of targets measured may be only a sample of the available targets. The sample may be determined using an optimization method such as that disclosed in WO2015110191A1. Since up-sampling will be effected by the process signature model, the number of samples can be fewer than the number required to perform earlier CPE techniques.

In an estimation step 210, a process signature model or "fingerprint" model is used to fit the measured data so as to describe this deviation from the ideal. This step is performed in a robust manner using a minimal number of parameters sufficient to characterize the deviations. The root cause of these deviations may be the processing of the wafer outside the lithographic apparatus 100, the lithographic apparatus itself or a combination of both.

The process signature model can be designed to represent the process signature, rather than being confined to the actuation parameters that can be controlled in the patterning operations. In one embodiment, the fingerprint model uses a Zernike function of radial and tangential overlay components. Zernike models fit better to the fingerprint characteristics of wafer process tools because a typical geometry of such tools is circular symmetric. For the same reason, describing overlay in radial and tangential (i.e., perpendicular to radial direction) components (as opposed to X and Y components) may provide a better fit. Other models that can be used to characterize a process fingerprint are Radial Basis Functions, Fourier series and polynomial series (e.g., Legendre). For typical process equipment fingerprints, additional parameters such as scan direction, scan velocity or expose sequence can be incorporated in the model in addition to r, theta or X, Y.

In a next step 520, noise reduced measurements may be calculated for any location on the wafer, therefore decoupling the model from the measurement locations. The result of this is a fingerprint calculated for a dense grid. In other words, the model provides an up-sampling functions as well as noise reduction. In this step it is possible to take into account the die layout. For example the grid may be calculated for only complete (and therefore potentially yielding) dies on the wafer.

In a step 530, the process signature model is used to calculate the necessary corrections per exposure. This is done by fitting the estimated process signature from the process model into an actuation model of the lithographic apparatus. All degrees of freedom of a lithographic process tool can be used in this step because the process signature model can be used to estimate required correction values for any location on the wafer. For example, the number of parameters may number over 6 or over 10, per exposed field. In one specific embodiment, 15 parameters per field are used. Estimation of the correction values can be done by using interpolation and extrapolation of the estimated process fingerprint model.

As explained in US2014089870A1, the process signature model provides a degree of noise reduction, as well as up-sampling. The present inventors have recognized, however, that in this noise reduction, some useful information from the measurement data is lost, that could actually be used to improve the calculated corrections. This will be for example the case with very localized effects, such as those arising in the vicinity of the wafer edge. Because these effects are too localized to be represented in the model, they are effectively discarded as noise. Within the known approach, the only solution would be to increase the number of model parameters, and/or add different types of model. The former approach would generally require a large number of additional measurements, and the latter approach brings significant complications.

Referring again to FIG. 2, step 240 in the method of the present disclosure makes a combination of actual measurement data from step 200 with the values estimated by the process signature model. This provides a modified estimate of the process effects that can be used in the actuation model instead of using the process signature model alone. The actual values in localized regions of the substrate can influence the final corrections, without being disregarded as noise. An illustrated example will now be provided, to illustrate the method and to describe one possible implementation.

Figure 3:
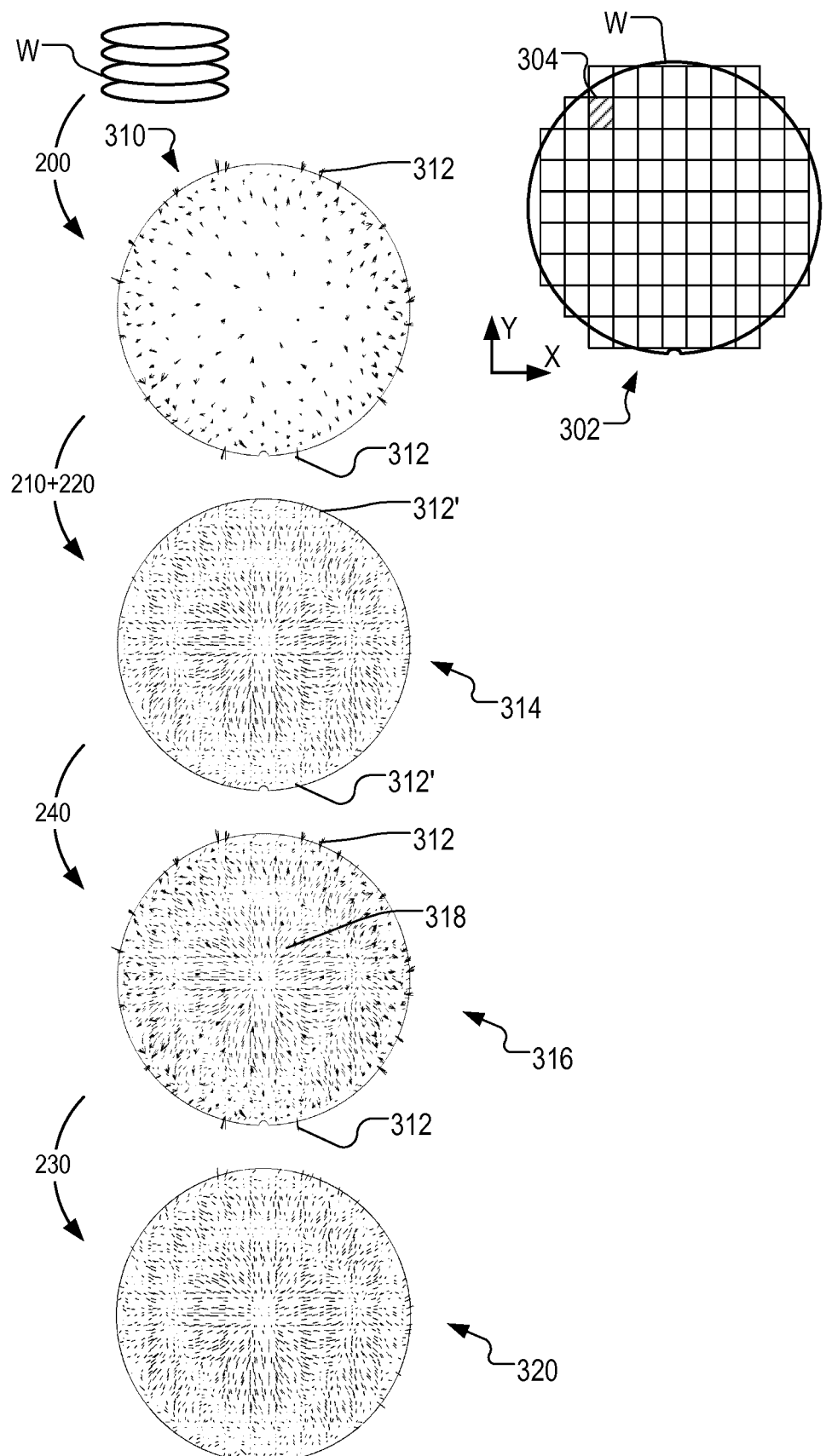
FIG. 3 illustrates the method of FIG. 2 with example measurement data from semiconductor substrates.

Referring now to FIG. 3, the steps of the FIG. 2 method are illustrated using, as an example, plots of overlay measured across a number of wafers in a real production facility. These wafers may be production wafers or calibration wafers, depending on the implementation, and depending whether the method is being applied in a set-up phase or in an ongoing production phase. The present technique has been developed particularly for application in the production phase, so it is assumed that the measured wafers are production wafers. At the top right in the diagram, a schematic layout of a wafer (substrate W) is indicated at 302. The area of the substrate is divided into fields in a regular grid pattern. One field 304 is highlighted. These fields form the portions to which a pattern is applied in a patterning operation performed by the lithographic apparatus 100.

After processing one or more layers in the production facility of FIG. 1, the wafer, or a representative sample set of wafers, are measured using the metrology apparatus 140. This is step 200 in the method of FIG. 2. The wafers in question may be for example any of those labeled 120, 132 or 134 in FIG. 1, being those which have undergone a patterning operation one or more physical and chemical processing steps. In the case of overlay metrology, the measurements may be made on metrology targets which (for example) comprise features formed in developed resist layer after the development step 112, and features formed in underlying layers have been formed by physical and chemical steps and a previous patterning operation. The overlay measurements can therefore reveal the components of process-induced distortions that have not been corrected by the alignment steps and other corrections when printing the pattern in the resist layer. Correction per exposure (CPE) seeks to reduce these uncorrected errors.

Measurement data 310 comprises overlay samples represented in the drawing by vectors. Each vector has an X component and a Y component, which may be measured separately and considered as separate performance parameters, but combined for the illustrative plot. The measured values may be from a single wafer, but more normally the measurements will be repeated over a few wafers and averaged together, for example 4 to 6 wafers. The distribution of samples has been determined by an optimization method as mentioned above. It will be seen that there is a slightly increased density of samples toward the edge of the wafer. The samples at the very edges include samples 312 significantly higher than average overlay, which is commonly found. Conventionally, such effects may simply reduce the yield of functional product dies at the edge of the wafer. Ideally, however, if these effects can be corrected using the degrees of freedom in the actuation system of the litho tool, the yield of good devices could be increased.

At 314 there is shown the estimate of process-induce overlay, generated at steps 210, 220 using the parameterized process signature model. As can be seen clearly, this model provides estimated values at any desired location on the substrate, not only those measured in step 200. This up-sampling effect is beneficial as described above. At the same time, noise in the measurement data is eliminated. As a by-product of the noise reduction function, in other words due to the limited form and parameter count of the model, some real effects, such as the high overlay in edge samples 312, become replaced by estimates 312' that are not representative of the real situation.

In the modified method, step 240 is performed which replaces some or all of those estimated values, at sample positions where a real measurement is available. As a result, an estimate 316 is produced in which estimated values 318 from the model are provided at some locations, and real measurements 312 at other locations. The method can be performed to replace all values where there are available measurements, or only some of them. For example, if the concern is only about edge effects, the step 240 could be performed to replace values only in the outer region of the substrate, for example in the region greater than 0.8 or 0.9 of the radius. In another case, it may be a central region where the real measurements are of greater value. In other case, it may be certain parts of each field where the measured data is of greater value.

The manner of combining the measurement data and the model data to generate a modified estimate does not need to be limited to simple substitution of values. Generalizing further, the manner of combing the measurement data and the model data to generate a modified estimate does not need to be the same in all regions of the substrate. In some situations, it might be preferred to combine the model estimate and the measured value, for example by averaging them. In other cases, it may be deemed desirable to allow the measurement data at one sample point to influence values of the estimate at neighboring sample points (i.e. extrapolating to some extent from the measured value). Careless extrapolation of course could introduce artificial errors. Extrapolation does not need to be the same in all directions. In an edge region, for example, extrapolation could be applied more in a tangential or circumferential direction than in a radial direction. These variants are all within the scope of the appended claims.

At 320 there is shown the corrections generated from the estimate 316, using the actuation model of the lithographic apparatus 100. As can be seen, while there are limitations in the degrees of control that can be achieved in actuation model, some of the measurement values 312 have clearly influenced the corrections in a way that would not be possible using the process model alone.

CONCLUSION

In conclusion, the present disclosure provides a method generating an estimate for use in defining corrections, which exploits a process model without losing useful information from the original measurement data. Particularly in the case of process effects that are highly localized, these can be taken into account without unduly increasing the complexity of the process model.

The disclosed method allows the provision of a lithographic apparatus and methods of operating a lithographic apparatus in which performance parameters such as overlay can be improved, without the need for additional measurements, or even with a reduced number of measurements. The dynamic selection can be performed with or without using additional context information. Throughput can be maintained and/or increased, without the loss of performance that might otherwise result.

The steps of combining the measurement data and the model can be performed in any suitable processing apparatus, which may located anywhere in the facility of FIG. 1, or may be physically remote from the facility. Embodiments of the invention may be implemented using a computer program containing one or more sequences of machine-readable instructions describing methods of combining process model values and measurement values as described above. This computer program may be executed for example within the control unit LACU of FIG. 1, or some other controller, for example within a metrology system that includes the metrology apparatus 140, or in an advanced process control system or separate advisory tool. There may also be provided a data storage medium (e.g., semiconductor memory, magnetic or optical disk) having such a computer program stored therein.

The CPE corrections may be generated in the supervisory control system of FIG. 1, or in the litho tool control unit LACU. They may be generated in a remote system and communicated to the facility afterwards. The process model and the measurement data may be delivered separately to a processing apparatus which then combines them as part of generating the corrections. Alternatively, the process model and the measurement data may be combined into a modified estimate, which is then delivered to the processing apparatus or software module that is responsible for generating the corrections. The latter module in that case need not be modified from its existing form. The processing apparatus that generates the modified estimate may then be a separate apparatus, or it may be part of the metrology system including metrology apparatus 140.

The embodiments may further be described using the following clauses:

1. A method of calculating corrections for use in a manufacturing process, the method comprising:
measuring a performance parameter at sampling locations across one or more substrates; fitting a process model to the measured performance parameter; and
calculating said corrections based at least in part on the fitted process model,
wherein the calculation of said corrections is based partly on the fitted process model and partly on the measured performance parameter.

2. A method according to clause 1, wherein the calculation of said corrections is based primarily on the measured performance parameter at one or more locations sampled in the measuring step and primarily on values of the fitted process model at other locations.

3. A method according to clause 1 or 2, wherein the fitted process model provides values with a greater sampling density than the sampling locations represented in the measured performance parameter.

4. A method according to any preceding clause, wherein the manufacturing process includes a lithographic patterning step in which a pattern is applied to a substrate, wherein the calculated corrections are for use in said patterning step 5. A method according to clause 4, wherein the calculated corrections are for use in controlling positioning of the applied pattern.

6. A method according to clause 4 or 5, wherein in the patterning step the pattern is applied repeatedly at a plurality of field locations across each substrate, and wherein the calculated corrections vary with the field location.

7. A method according to any preceding clause, wherein the performance parameter is measured over a plurality of substrates and measured values from those substrates are combined for use as the measurement performance parameter.

8. A method according to any preceding clause, wherein the performance parameter is overlay.

9. A metrology system for obtaining measurements for use in monitoring a manufacturing process, the metrology system comprising:
inspection apparatus for measuring a performance parameter at sampling locations across one or more substrates; and
a processing apparatus for fitting a process model to the measured performance parameter, and generating an estimate of process effects to be corrected in the manufacturing process,
wherein the processing apparatus is arranged to generate the estimate of process effects based partly on the fitted process model and partly on the measured performance parameter.

10. A metrology system according to clause 9, wherein the processing apparatus is arranged to generate said estimate of process effects based primarily on the measured performance parameter at one or more locations measured by the inspection apparatus and primarily on values of the fitted process model at other locations.

11. A metrology system according to clause 9 or 10, wherein the fitted process model provides values with a greater sampling density than the sampling locations represented in the measured performance parameter.

12. A metrology system according to clause 9, 10 or 11, wherein the inspection apparatus is arranged to measure performance parameter over a number of substrates and the processing apparatus is arranged to combine measured values from the number of substrates in the fitting of the process model.

13. A manufacturing system comprising a metrology system according to any of clauses 9 to 12, in combination with at least one processing apparatus and a controller, the controller being arranged to calculate corrections based on the generated estimate of process effects and to control the processing apparatus to use the calculated corrections in processing one or more substrates.

14. A manufacturing system according to clause 13, wherein said processing apparatus is a lithographic apparatus and wherein the controller is arranged to control a lithographic patterning step in which a pattern is applied to a substrate.

15. A manufacturing system according to clause 14, wherein the calculated corrections are for use in controlling positioning of the applied pattern.

16. A manufacturing system according to clause 14 or 15, wherein the lithographic apparatus is arranged to apply a pattern repeatedly at a plurality of field locations across each substrate, and wherein the corrections vary with the field location.

17. A device manufacturing method comprising applying patterns in one or more layers on a substrate and processing the substrate to produce functional device features, wherein processing of at least one of said layers is controlled using corrections calculated by a method according to any of clauses 1 to 8.

18. A computer program product comprising instructions for causing a programmable data processing apparatus to perform as the processing apparatus of a metrology system according to any of clauses 9 to 12.

19. A method of modeling a performance parameter across a substrate, the method comprising:
measuring a performance parameter at sampling locations across one or more substrates;
fitting a process model to the measured performance parameter; and
generating an estimate of process effects present on the substrate,
wherein the estimate of process effects is generated using both the fitted process model and the measured performance parameter.

20. A method according to clause 19, wherein the generated estimate of process effects is based primarily on the measured performance parameter at one or more of the sampling locations measured in the measuring step, and primarily on values of the fitted process model at other locations.

21. A method according to clause 19 or 20, wherein the fitted process model provides values with a greater sampling density than the sampling locations represented in the measured performance parameter.

22. A method according to clause 19, 20 or 21, wherein the performance parameter is measured over a number of substrates and the measured values from the number of substrates are combined for use in the fitting of the process model.

23. A computer program product comprising instructions for causing a programmable data processing apparatus to generate the estimate of process effects in a method according to any of clauses 9 to 12.

As mentioned above, the patterning step of a lithographic manufacturing process is only one example where the principles of the present disclosure may be applied. Other parts of the lithographic process, and other types of manufacturing process, may also benefit from the generation of modified estimates and corrections in the manner disclosed herein.

These and other modifications and variations can be envisaged by the skilled reader from a consideration of the present disclosure. The breadth and scope of the present invention should not be limited by any of the above-described exemplary embodiments, but should be defined only in accordance with the following claims and their equivalents.

The invention claimed is:

1. A method comprising:
obtaining measurements of a performance parameter at sampling locations across one or more substrates;
fitting, by a hardware computer system, a process model to the obtained measurements of the performance parameter; and
calculating corrections for use in a manufacturing process based at least in part on the fitted process model,
wherein the calculation of the corrections is based partly on the fitted process model and partly on the obtained measurements of the performance parameter.

2. The method as claimed in claim 1, wherein the calculation of the corrections is based primarily on the obtained measurements of the performance parameter at sampled one or more locations and primarily on values of the fitted process model at other locations.

3. The method as claimed in claim 1, wherein the fitted process model provides values with a greater sampling density than the sampling locations represented in the obtained measurements of the performance parameter.

4. The method as claimed in claim 1, wherein the manufacturing process includes a lithographic patterning step in which a pattern is applied to a substrate, and wherein the calculated corrections are for use in the patterning step.

5. The method as claimed in claim 4, wherein the calculated corrections are for use in controlling positioning of the applied pattern.

6. The method as claimed in claim 4, wherein in the patterning step the pattern is applied repeatedly at a plurality of field locations across each substrate, and wherein the calculated corrections vary with the field location.

7. The method as claimed in claim 1, wherein the performance parameter is measured over a plurality of substrates and measured values from those substrates are combined for use as the measurement performance parameter.

8. The method as claimed in claim 1, wherein the performance parameter is overlay.

9. A metrology system for obtaining measurements for use in monitoring a manufacturing process, the metrology system comprising:
  inspection apparatus configured to measure a performance parameter at sampling locations across one or more substrates; and
  a processing apparatus configured to fit a process model to the measured performance parameter, and generate an estimate of process effects to be corrected in the manufacturing process,
  wherein the processing apparatus is configured to generate the estimate of process effects based partly on the fitted process model and partly on the measured performance parameter.

10. The metrology system as claimed in claim 9, wherein the processing apparatus is configured to generate the estimate of process effects based primarily on the measured performance parameter at one or more locations measured by the inspection apparatus and primarily on values of the fitted process model at other locations.

11. The metrology system as claimed in claim 9, wherein the inspection apparatus is configured to measure the performance parameter over a number of substrates and the processing apparatus is configured to combine measured values from the number of substrates in the fitting of the process model.

12. A manufacturing system comprising the metrology system as claimed in claim 9, in combination with at least one processing apparatus and a controller, the controller configured to calculate corrections based on the generated estimate of process effects and to control the at least one processing apparatus to use the calculated corrections in processing one or more substrates.

13. A device manufacturing method comprising applying patterns in one or more layers on a substrate and processing the substrate to produce functional device features, wherein processing of at least one of the layers is controlled using corrections calculated by the method as claimed in claim 1.

14. A method comprising:
  obtaining measurements of a performance parameter at sampling locations across one or more substrates;
  fitting, by a hardware computer system, a process model to the measured performance parameter; and
  generating an estimate of process effects present on the substrate,
  wherein the estimate of process effects is generated using both the fitted process model and the measured performance parameter.

15. A non-transitory computer program product comprising instructions configured to cause a programmable data processing apparatus to at least:
  obtain measurements of a performance parameter at sampling locations across one or more substrates;
  fit a process model to the obtained measurements of the performance parameter; and
  calculate corrections for use in a manufacturing process based at least in part on the fitted process model,
  wherein the calculation of the corrections is based partly on the fitted process model and partly on the obtained measurements of the performance parameter.

16. The method according to claim 14, wherein the generated estimate of process effects is based primarily on the measured performance parameter at sampled one or more of locations and primarily on values of the fitted process model at other locations.

17. The method according to claim 14, wherein the fitted process model provides values with a greater sampling density than the sampling locations represented in the measured performance parameter.

18. The method according to claim 14, wherein the performance parameter is measured over a number of substrates and the measured values from the number of substrates are combined for use in the fitting of the process model.

19. The method according to claim 14, wherein the performance parameter is overlay.

20. A non-transitory computer program product comprising instructions configured to cause a programmable data processing apparatus to at least:
  obtain measurements of a performance parameter at sampling locations across one or more substrates;
  fit a process model to the measured performance parameter; and
  generate an estimate of process effects present on the substrate, wherein the estimate of process effects is generated using both the fitted process model and the measured performance parameter.

* * * * *